United States Patent
Chlebosz et al.

(10) Patent No.: US 10,224,752 B2
(45) Date of Patent: Mar. 5, 2019

(54) METHOD AND APPARATUS FOR COMPUTER AIDED DESIGNING, TUNING AND MATCHING OF WIRELESS POWER TRANSFER SYSTEMS

(71) Applicant: QUALCOMM Incorporated, San Diego, CA (US)

(72) Inventors: Wojciech Adam Chlebosz, Taufkirchen (DE); Daniel Kuerschner, Grasbrunn (DE)

(73) Assignee: QUALCOMM Incorporated, San Diego, CA (US)

( * ) Notice: Subject to any disclaimer, the term of this patent is extended or adjusted under 35 U.S.C. 154(b) by 445 days.

(21) Appl. No.: 15/019,704

(22) Filed: Feb. 9, 2016

(65) Prior Publication Data

US 2017/0063159 A1    Mar. 2, 2017

Related U.S. Application Data

(60) Provisional application No. 62/211,565, filed on Aug. 28, 2015.

(51) Int. Cl.
*H02J 50/12* (2016.01)
*B60L 11/18* (2006.01)
(Continued)

(52) U.S. Cl.
CPC ............ *H02J 50/12* (2016.02); *B60L 11/182* (2013.01); *G06F 17/5036* (2013.01); *H01F 38/14* (2013.01)

(58) Field of Classification Search
CPC ............................. H01F 38/14; G06F 17/5036
See application file for complete search history.

(56) References Cited

U.S. PATENT DOCUMENTS

| 8,432,066 | B2 | 4/2013 | Takada et al. |
| 8,675,680 | B2* | 3/2014 | Trainor .................. H04W 4/02 370/466 |

(Continued)

FOREIGN PATENT DOCUMENTS

CN        103986243 A    8/2014

OTHER PUBLICATIONS

Cheon S., et al., "Circuit-Model-Based Analysis of a Wireless Energy-Transfer System via Coupled Magnetic Resonances," IEEE Transactions on Industrial Electronics, Jul. 2011, vol. 58 (7), pp. 2906-2914.

(Continued)

*Primary Examiner* — Thienvu Tran
*Assistant Examiner* — Pinping Sun
(74) *Attorney, Agent, or Firm* — Knobbe, Martens, Olson & Bear LLP

(57) ABSTRACT

An apparatus for designing, tuning and matching of wireless power transfer systems comprises a processor. The processor is configured to determine electrical circuit parameters of a wireless power transfer system for each combination of a plurality of characteristics for the wireless power transfer system that are within respective ranges for each of the plurality of characteristics. The processor is configured to select a first group of combinations of the plurality of characteristics for which the electrical circuit parameters determined satisfy a set of user design constraints. The processor is configured to validate a second group of combinations selected from the first group of combinations that satisfy a performance requirement of the wireless power transfer system.

30 Claims, 10 Drawing Sheets

(51) Int. Cl.
G06F 17/50 (2006.01)
H01F 38/14 (2006.01)

(56) References Cited

U.S. PATENT DOCUMENTS

| | | | | |
|---|---|---|---|---|
| 2009/0200985 A1* | 8/2009 | Zane | ................... | H01Q 1/2225 |
| | | | | 320/108 |
| 2013/0113296 A1* | 5/2013 | Ryu | ....................... | H02J 7/025 |
| | | | | 307/104 |
| 2014/0015327 A1* | 1/2014 | Keeling | ................ | B60L 11/182 |
| | | | | 307/104 |
| 2014/0080409 A1* | 3/2014 | Frankland | ............... | H02J 5/005 |
| | | | | 455/41.1 |
| 2014/0084701 A1* | 3/2014 | Bae | ......................... | H02J 5/005 |
| | | | | 307/104 |
| 2014/0176243 A1* | 6/2014 | Trainor | ................. | H03F 1/0261 |
| | | | | 330/296 |
| 2015/0073768 A1* | 3/2015 | Kurs | .................. | G06F 17/5036 |
| | | | | 703/13 |
| 2016/0301256 A1* | 10/2016 | Zeine | ................... | H04W 4/023 |

OTHER PUBLICATIONS

International Search Report and Written Opinion—PCT/US2016/047063—ISA/EPO—dated Sep. 30, 2016.

\* cited by examiner ental Application No. 62/211,565 is hereby expressly incorporated by reference herein.

METHOD AND APPARATUS FOR COMPUTER AIDED DESIGNING, TUNING AND MATCHING OF WIRELESS POWER TRANSFER SYSTEMS

CLAIM OF PRIORITY UNDER 35 U.S.C. § 119

The present Application for Patent claims priority to Provisional Application No. 62/211,565 entitled "METHOD AND APPARATUS FOR COMPUTER AIDED DESIGNING, TUNING AND MATCHING OF WIRELESS POWER TRANSFER SYSTEMS" filed Aug. 28, 2015, and assigned to the assignee hereof. Provisional Application No. 62/211,565 is hereby expressly incorporated by reference herein.

FIELD

This application is generally related to wireless power transfer, and more specifically to methods and apparatuses for computer aided designing, tuning and matching of wireless power transfer systems.

BACKGROUND

Electrical, mechanical and performance requirements for wireless electric vehicle charging (WEVC) systems are highly individual and customer specific. However, manually designing each aspect of such systems is very time intensive. Accordingly, methods and apparatuses for computer aided design, tuning and matching of wireless power transfer systems are desirable.

SUMMARY

According to some implementations, an apparatus for designing, tuning and matching of wireless power transfer systems is provided. The apparatus comprises a processor. The processor is configured to determine electrical circuit parameters of a wireless power transfer system for each combination of a plurality of characteristics for the wireless power transfer system that are within respective ranges for each of the plurality of characteristics. The processor is configured to select a first group of combinations of the plurality of characteristics for which the electrical circuit parameters determined satisfy a set of user design constraints. The processor is configured to validate a second group of combinations selected from the first group of combinations that satisfy a performance requirement of the wireless power transfer system.

In some other implementations, method for designing, tuning and matching of wireless power transfer systems is provided. The method comprises determining electrical circuit parameters of a wireless power transfer system for each combination of a plurality of characteristics for the wireless power transfer system that are within respective ranges for each of the plurality of characteristics. The method comprises selecting a first group of combinations of the plurality of characteristics for which the electrical circuit parameters determined satisfy a set of user design constraints. The method comprises validating a second group of combinations selected from the first group of combinations that satisfy a performance requirement of the wireless power transfer system.

In yet other implementations, a non-transitory, computer-readable medium comprising code that, when executed, causes an apparatus for designing, tuning and matching of wireless power transfer systems to determine electrical circuit parameters of a wireless power transfer system for each combination of a plurality of characteristics for the wireless power transfer system that are within respective ranges for each of the plurality of characteristics. The code, when executed, further causes the apparatus to select a first group of combinations of the plurality of characteristics for which the electrical circuit parameters determined satisfy a set of user design constraints. The code, when executed, further causes the apparatus to validate a second group of combinations selected from the first group of combinations that satisfy a performance requirement of the wireless power transfer system.

In yet other implementations, an apparatus for wirelessly transferring charging power is provided. The apparatus comprises means for determining electrical circuit parameters of a wireless power transfer system for each combination of a plurality of characteristics for the wireless power transfer system that are within respective ranges for each of the plurality of characteristics. The apparatus comprises means for selecting a first group of combinations of the plurality of characteristics for which the electrical circuit parameters determined satisfy a set of user design constraints. The apparatus comprises means for validating a second group of combinations selected from the first group of combinations that satisfy a performance requirement of the wireless power transfer system.

In yet other implementations, an apparatus for wirelessly transferring charging power is provided. The apparatus comprises a processor. The processor is configured to determine electrical circuit parameters of a wireless power transfer system for each combination of a number of turns in a primary coil and a number of turns in a secondary coil for the wireless power transfer system that are within a first range of the number of turns in the primary coil and within a second range of the number of turns of the secondary coil. The processor is configured to select a first group of combinations of the number of turns in the primary coil and the number of turns in the secondary coil that satisfy a set of user design constraints. The processor is configured to validate a second group of combinations selected from the first group of combinations that result in a loaded quality factor of the wireless power transfer system within a predetermined range.

DETAILED DESCRIPTION

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) may be received, captured, or coupled by a "receive coupler" to achieve power transfer.

The terminology used herein is for the purpose of describing particular implementations only and is not intended to be limiting on the disclosure. It will be understood that if a specific number of a claim element is intended, such intent will be explicitly recited in the claim, and in the absence of such recitation, no such intent is present. For example, as used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Figure 1:
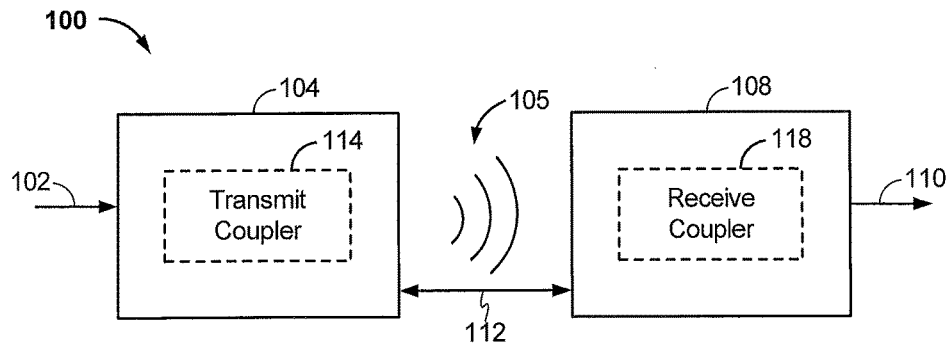
FIG. 1 is a functional block diagram of a wireless power transfer system, in accordance with some implementations.

FIG. 1 is a functional block diagram of a wireless power transfer system 100, in accordance with some implementations. Input power 102 may be provided to a transmitter 104 from a power source (not shown) to generate a wireless field 105 (e.g., magnetic or electromagnetic) via a transmit coupler 114 for performing energy transfer. The receiver 108 may receive power when the receiver 108 is located in the wireless field 105 produced by the transmitter 104. The wireless field 105 corresponds to a region where energy output by the transmitter 104 may be captured by the receiver 108. A receiver 108 including a receiver coupler 118 may couple to the wireless field 105 and generate output power 110 for storing or consumption by a device (not shown in this figure) coupled to the output power 110. Both the transmitter 104 and the receiver 108 are separated by a distance 112. Transfer of energy occurs by coupling energy from the wireless field 105 of the transmit coupler 114 to the receive coupler 118, residing in the vicinity of the wireless field 105, rather than propagating the energy from the transmit coupler 114 into free space.

In one example implementation, power is transferred inductively via a time-varying magnetic field generated by the transmit coupler 114. The transmitter 104 and the receiver 108 may further be configured according to a mutual resonant relationship. When the resonant frequency of the receiver 108 and the resonant frequency of the transmitter 104 are substantially the same or very close, transmission losses between the transmitter 104 and the receiver 108 are minimal. Resonant inductive coupling techniques may allow for improved efficiency and power transfer over various distances and with a variety of inductive coupler configurations. However, even when resonance between the transmitter 104 and receiver 108 are not matched, energy may be transferred, although the efficiency may be reduced. For example, the efficiency may be less when resonance is not matched.

In some implementations, the wireless field 105 corresponds to the "near-field" of the transmitter 104. The near-field may correspond to a region in which there are strong reactive fields resulting from the currents and charges in the transmit coupler 114 that minimally radiate power away from the transmit coupler 114. The near-field may correspond to a region that is within about one wavelength (or a fraction thereof) of the transmit coupler 114. Efficient energy transfer may occur by coupling a large portion of the energy in the wireless field 105 to the receive coupler 118 rather than propagating most of the energy in an electromagnetic wave to the far field.

Figure 2:
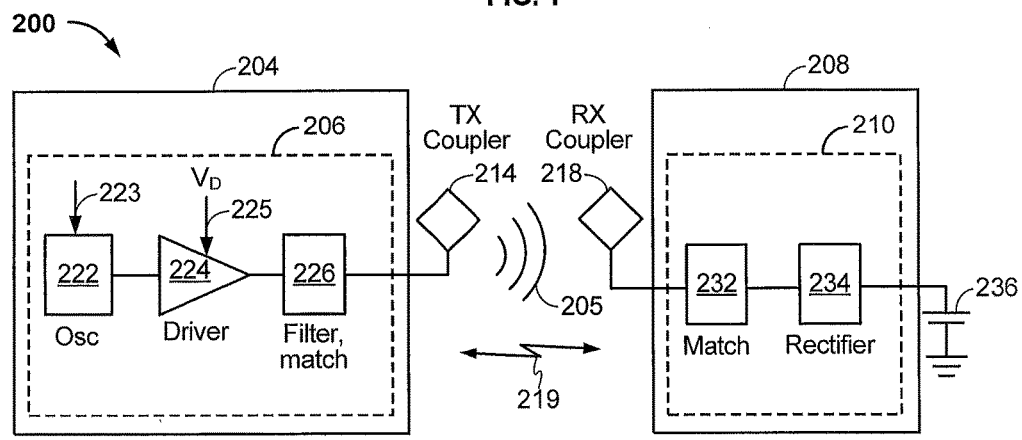
FIG. 2 is a functional block diagram of a wireless power transfer system, in accordance with some other implementations.

FIG. 2 is a functional block diagram of a wireless power transfer system 200, in accordance with some other implementations. The system 200 may be a wireless power transfer system of similar operation and functionality as the system 100 of FIG. 1. However, the system 200 provides additional details regarding the components of the wireless power transfer system 200 as compared to FIG. 1. The system 200 includes a transmitter 204 and a receiver 208. The transmitter 204 includes transmit circuitry 206 that includes an oscillator 222, a driver circuit 224, and a filter and matching circuit 226. The oscillator 222 may be configured to generate a signal at a desired frequency that may be adjusted in response to a frequency control signal 223. The oscillator 222 provides the oscillator signal to the driver circuit 224. The driver circuit 224 may be configured to drive the transmit coupler 214 at a resonant frequency of the transmit coupler 214 based on an input voltage signal ($V_D$) 225.

The filter and matching circuit 226 filters out harmonics or other unwanted frequencies and matches the impedance of the transmit circuitry 206 to the impedance of the transmit coupler 214. As a result of driving the transmit coupler 214, the transmit coupler 214 generates a wireless field 205 to wirelessly output power at a level sufficient for charging a battery 236.

The receiver 208 comprises receive circuitry 210 that includes a matching circuit 232 and a rectifier circuit 234. The matching circuit 232 may match the impedance of the receive circuitry 210 to the impedance of the receive coupler 218. The rectifier circuit 234 may generate a direct current (DC) power output from an alternate current (AC) power input to charge the battery 236. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205. In some implementations, the receiver 208 may be configured to determine whether an amount of power transmitted by the transmitter 204 and received by the receiver 208 is appropriate for charging the battery 236.

Figure 3:
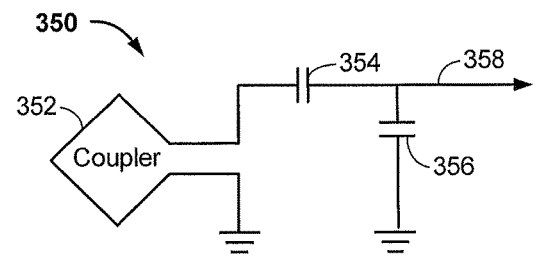
FIG. 3 is a schematic diagram of a portion of transmit circuitry or receive circuitry of FIG. 2 including a transmit or receive coupler, in accordance with some implementations.

FIG. 3 is a schematic diagram of a portion of the transmit circuitry 206 or the receive circuitry 210 of FIG. 2, in accordance with some implementations. As illustrated in FIG. 3, transmit or receive circuitry 350 may include a coupler 352. The coupler 352 may also be referred to or be configured as a "conductor loop", a coil, an inductor, an antenna, or a "magnetic" coupler. The term "coupler" generally refers to a component that may wirelessly output or receive energy for coupling to another "coupler."

The resonant frequency of the loop or magnetic couplers is based on the inductance and capacitance of the loop or magnetic coupler. Inductance may be simply the inductance created by the coupler 352, whereas, capacitance may be added via a capacitor 354 (or the self-capacitance of the coupler 352) to create a resonant structure at a desired resonant frequency. As a non-limiting example, a capacitor 354 and a capacitor 356 may be added to the transmit or receive circuitry 350 to create a resonant circuit that resonates at a resonant frequency. For larger sized couplers using large diameter couplers exhibiting larger inductance, the value of capacitance needed to produce resonance may be lower. Furthermore, as the size of the coupler increases, coupling efficiency may increase. This is mainly true if the size of both transmit and receive couplers increase. For transmit couplers, the signal 358, with a frequency that substantially corresponds to the resonant frequency of the coupler 352, may be an input to the coupler 352. For receive couplers, the signal 358 may be output for use in powering or charging a load.

Figure 4:
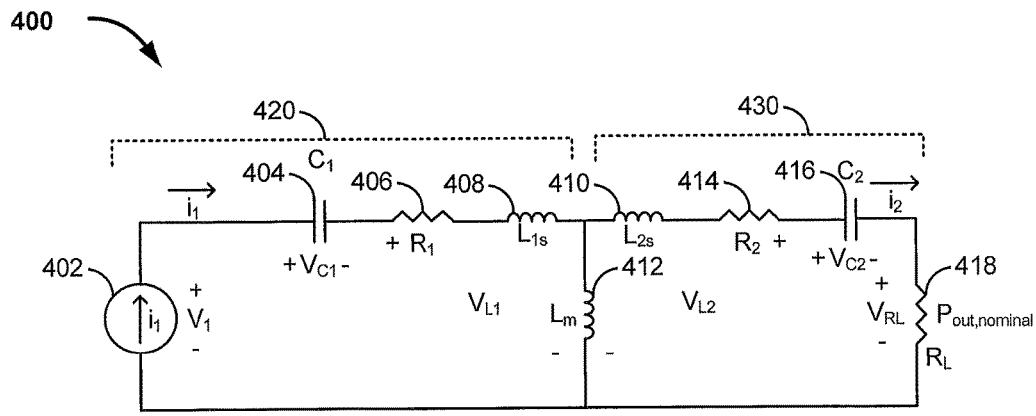
FIG. 4 is an equivalent circuit diagram of a series-series tuned wireless power transfer system, as viewed from the primary side, in accordance with some implementations.

FIG. 4 is an equivalent circuit diagram of a series-series tuned wireless power transfer system 400, as viewed from the primary side, in accordance with some implementations. The wireless power transfer system 400 includes a wireless power transmitter 420 and a wireless power receiver 430. The wireless power transmitter 420 may include a primary power source 402. In some implementations, the primary power source 402 may comprise a current source configured to provide a current $i_1$. In some other implementations, the primary power source 402 may comprise a voltage source providing a voltage $V_1$. Driving a current into the circuitry of the wireless power transmitter 420 may cause a voltage $V_1$ to appear across the terminals of the primary power source 402. The wireless power transmitter 420 includes a first capacitor 404 having a capacitance $C_1$, which may comprise or represent a resonant capacitor. During operation, a voltage $V_{C1}$ may appear across the terminals of the first capacitor 404. The wireless power transmitter 420 further includes a first resistance 406 having a resistance $R_1$, which may comprise or represent an intrinsic resistance of a primary coil (e.g., a transmit coil). The wireless power transmitter 420 further includes a first leakage inductance 408, having inductance $L_{1S}$, of the primary coil. The wireless power transmitter 420 further shares a mutual inductance 412, having an inductance $L_M$, with the wireless power receiver 430. The primary coil impedance may be represented by the combination of the first resistance 406, the first leakage inductance 408, and the mutual inductance 412. The first leakage inductance 408 is associated with portions of magnetic flux generated by the primary coil that do not couple with the secondary coil, while the mutual inductance 412 is associated with portions of the magnetic flux generated by the primary coil that do couple with the secondary coil. Driving current into the primary coil causes a voltage $V_{L1}$ to appear across the primary coil.

The wireless power receiver 430 includes a second leakage inductance 410, having an inductance of $L_{2S}$, of a secondary coil (e.g., a receive coil) and the mutual inductance 412 shared with the wireless power transmitter 420. The wireless power receiver 430 further includes a second resistance 414, which may comprise or represent an intrinsic resistance of the secondary coil. An alternating magnetic field generated by the primary coil when driven by the primary power source 402 may induce a voltage across the secondary coil. The secondary coil impedance may comprise the second resistance 414, the second leakage inductance 410 and the mutual inductance 412. Thus, the induced voltage $V_{L2}$ is shown as appearing across the series combination of the second resistance 414, the second leakage inductance 410 and the mutual inductance 412. The wireless power receiver 430 may further include a second capacitor 416, having a capacitance $C_2$, which may comprise or represent a resonant capacitor. In operation, a voltage $V_{C2}$ appears across the terminals of the second capacitor 416. The wireless power receiver 430 may further include a load 418, having a resistance $R_L$, which may comprise or represent all impedances loading the wireless power receiver 430, or alternatively, at least a battery configured to receive charging power.

The wireless power receiver 430 is shown having a series-series tuned topology. Thus, the first capacitor 404 is shown in series with the primary coil, represented by the series combination of the first resistance 406, the first leakage inductance 408 and the mutual inductance 412. Likewise, the second capacitor 416 is shown in series with the secondary coil, represented by the series combination of the second resistance 414, the second leakage inductance 410 and the mutual inductance 412. Moreover, the values of $L_{2S}$, $R_2$, $C_2$ and $R_L$, as well as the voltages appearing across them and/or currents passing through them, are represented as they would appear from the wireless power transmitter side (e.g., the primary side) since, in the physical implementation, the electrical components of the wireless power receiver 430 are electrically linked to the wireless power transmitter 420 via tightly or loosely coupled transformer action between the primary and secondary coils.

Figure 5:
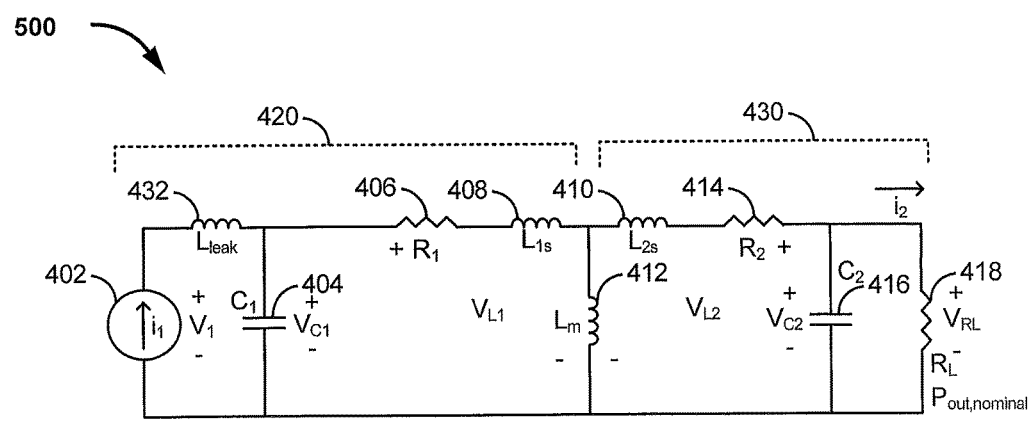
FIG. 5 is an equivalent circuit diagram of a parallel-parallel tuned wireless power transfer system, as viewed from the primary side, in accordance with some implementations.

FIG. 5 is an equivalent circuit diagram of a parallel-parallel tuned wireless power transfer system 500, as viewed from the primary side, in accordance with some implementations. The wireless power transfer system 500 includes each electrical component oriented as previously described in connection with FIG. 4, except that the first capacitor 404 is connected in parallel with the power source 402 and the primary coil, represented by the first resistance 406, the first leakage inductance 408 and the mutual inductance 412. Likewise, the second capacitor 416 is connected in parallel with the load 418 and the secondary coil, represented by the second resistance 414, the second leakage inductance 410 and the mutual inductance 412. In addition, in some implementations for the parallel-tuned wireless power transfer system 500, a transformer (not shown) is additionally included within the wireless power transmitter 420. A leakage inductance $L_{leak}$ of this transformer is shown as an inductor 432 located in series with the primary power source 402. In some implementations, the full transformer ratio (e.g., N:1 turns ratio) may also be considered. Use of such a transformer is also optional for series tuned (and partial series tuned) implementations, such as that previously shown in FIG. 4 and in FIG. 6 below.

Figure 6:
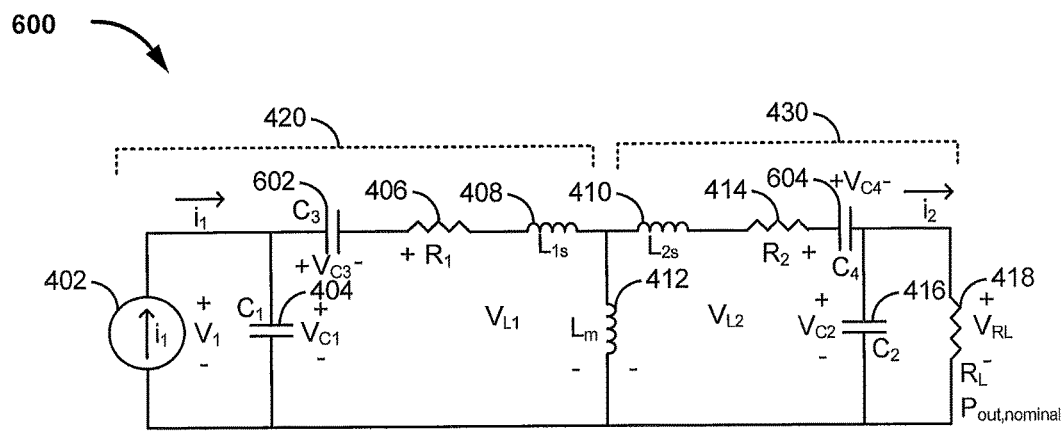
FIG. 6 is an equivalent circuit diagram of a parallel-parallel (partial series) tuned wireless power transfer system, as viewed from the primary side, in accordance with some implementations.

FIG. 6 is an equivalent circuit diagram of a parallel-parallel (partial series) tuned wireless power transfer system 600, as viewed from the primary side, in accordance with some implementations. The wireless power transfer system 600 includes each electrical component oriented as previously described in connection with FIG. 5, except that a third capacitor 602, having a capacitance $C_3$, is also connected in series with the primary coil, represented by the first resistance 406, the first leakage inductance 408 and the mutual inductance 412. Likewise, a fourth capacitor 604 is connected in series with the secondary coil, represented by the second resistance 414, the second leakage inductance 410 and the mutual inductance 412.

Although FIGS. 4-6 show series-series, parallel-parallel, and parallel-parallel (partial series), tuned implementations, respectively, the present application is not so limited and also contemplates any combination of the above for either the wireless power transmitter 420 or the wireless power receiver 430. Moreover, any primary coil and secondary coil magnetics topology may also be utilized. Non-limiting examples of such magnetics topologies may include single coil arrangements, a plurality of coplanar coil arrangements, double-D (DD) coil arrangements, double-D quadrature (DDQ) coil arrangements, bipolar coil arrangements, or any other known or currently unknown magnetics topologies.

Moreover, in some implementations, it may be desirable to be able to select a capacitor calculation method from a plurality of choices. For example, with respect to at least FIGS. 4 and 5, each of the base pad (wireless power transmitter 420) side capacitor $C_1$, and the vehicle pad (wireless power receiver 430) side capacitor $C_2$ may be calculated according to one of at least three methods: a sigma-compensation method (also known as "open circuit" compensation), an L-compensation method, and a G-compensation (also known as "short circuit" compensation) method. With respect to the component values described in connection with FIGS. 4 and 5, the sigma compensation method may utilize Equations (EQ) 1 and 2 below for $C_1$ and $C_2$, respectively:

$$C_1 = 1/(\omega_R^2 L_{1s}) \qquad \text{EQ. 1:}$$

and $$C_2 = 1/(\omega_R^2 L_{2s}) \qquad \text{EQ. 2}$$

The L-compensation method may utilize Equations 3 and 4 below for $C_1$ and $C_2$, respectively, where $L_m^*$ in Eq. 4 is $L_m$ of FIGS. 4-6 adjusted to take into account the primary to secondary coil turns count ratio:

$$C_1 = 1/[\omega_R^2 (L_{1s} + L_m)] \qquad \text{EQ. 3:}$$

and $$C_2 = 1/[\omega_R^2 (L_{2s} + L_m^*)] \qquad \text{EQ. 4:}$$

The G-compensation method may utilize Equations 5 and 6 below for $C_1$ and $C_{2,}$ respectively, where $L_m^*$ in Eq. 6 is $L_m$ of FIGS. 4-6 adjusted to take into account the primary to secondary coil turns count ratio, $L_{1s}^*$ is $L_{1s}$ of FIGS. 4-6 adjusted to take into account the primary to secondary coil turns count ratio, and $L_{2*}$ is $L_{2s}$ of FIGS. 4-6 adjusted to take into account the primary to secondary coil turns count ratio:

$$C_1 = 1/[\omega_R^2 (L_{1s} + (L_m \times L_{2s*}/(L_m + L_{2s*})))] \qquad \text{EQ. 5:}$$

$$C_2 = 1/[\omega_R^2 (L_{2s} + (L_{m*} \times L_{1s*}/(L_{m*} + L_{1s*})))] \qquad \text{EQ. 6:}$$

Electrical, mechanical and performance requirements for WEVC systems are highly individual to specific customer requirements. For example, auto manufacturers wishing to include WEVC systems (such as that shown in FIGS. 4-6 or any other tuning or coil configuration) into their vehicles may have specific vehicle pad package and/or mounting requirements, primary power source 402 voltage ($V_1$) or battery voltage ($V_{RL}$) requirements, power transfer ($P_{out,nominal}$) requirements, and/or coupling factor or coupling coefficient (k) requirements (which may depend on both the magnetics configurations of and x/y/z offset between the primary coil and the secondary coil). In order to meet such performance requirements, completely new WEVC system design is often required on a customer by customer basis. This often results in many man-hours of manual engineering calculation and work since efficient resonance operation of the WEVC system may require the calculation of many different tuning, impedance matching and turns count values. Thus, many iterative calculation steps traditionally are carried out by engineers, which results in an unacceptably high engineering effort in terms of one or both of time and financial cost.

Thus, the present application contemplates automated design, calculation and/or determination of tuning and matching component values for the varied components of a wireless power transfer system (see FIGS. 4-6) for each combination of a plurality of characteristics for the wireless power transfer system that are within respective ranges for each of the plurality of characteristics. Such characteristics may include but are not limited to a turns count of each of the primary coil and the secondary coil in the wireless power transfer system since it may be desirable for these parameters to be tested and validated manually before starting an experimental test or mockup phase. Thus, instead of performing several manual, iterative steps, the tuning and matching engineering process can be improved by employing the proposed algorithms and methodology. This may include but is not limited to computer-aided determination of tuning and/or impedance matching parameters including but not limited to turns counts of the primary and secondary coils, as well as a plausibility and/or feasibility check of the determined WEVC system design parameters, as will be described in more detail below.

Figure 7:
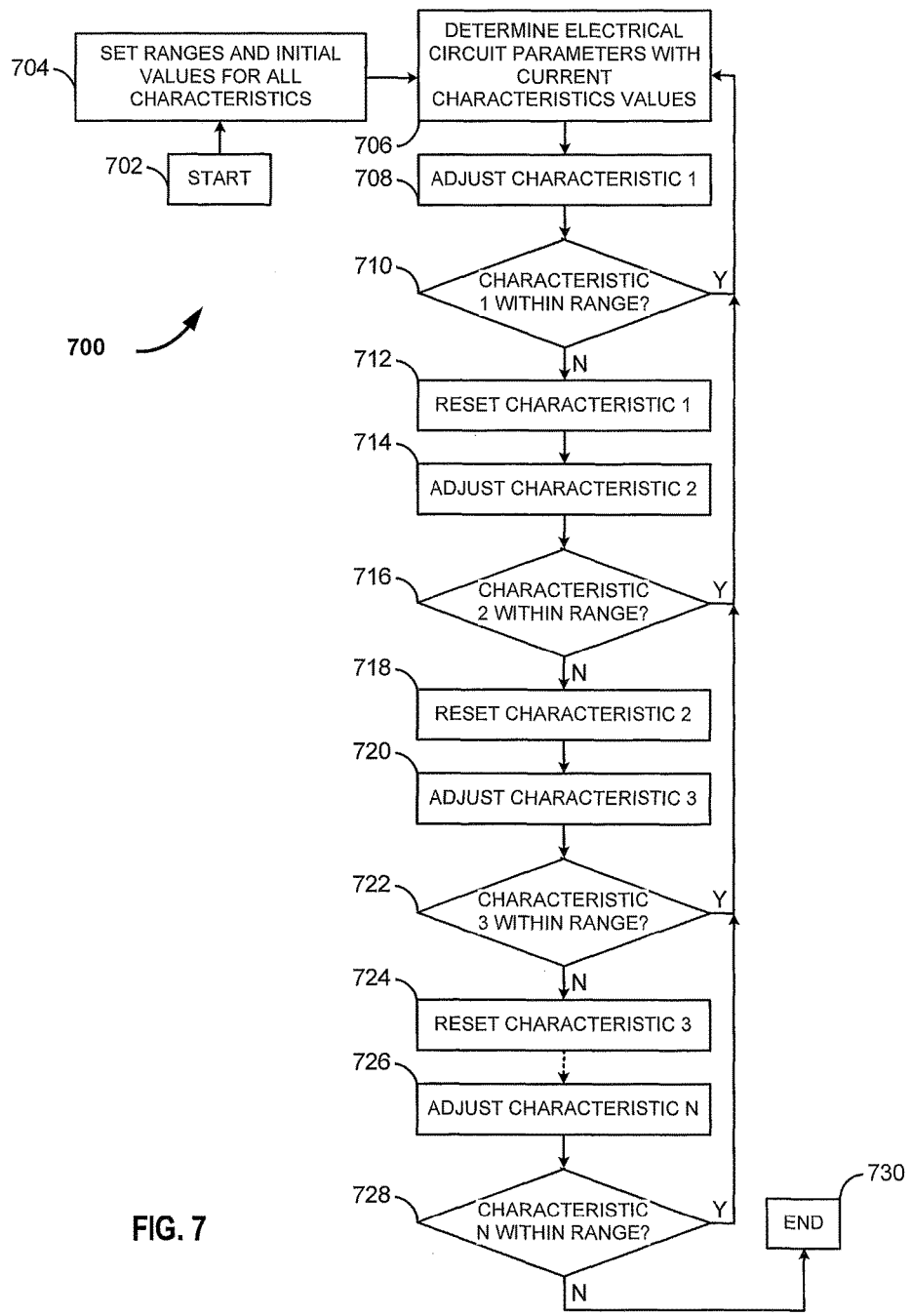
FIG. 7 is a flowchart for a method of determining electrical circuit parameters of a wireless power transfer system for each combination of a plurality of characteristics for the wireless power transfer system that are within respective ranges for each of the plurality of characteristics, in accordance with some implementations.

FIG. 7 is a flowchart 700 for a method of determining electrical circuit component values in a wireless power transfer system for each combination of a plurality of characteristics for the wireless power transfer system that are within respective ranges for each of the plurality of characteristics, in accordance with some implementations. In some implementations, reference to a wireless power transfer system may be to the wireless power transfer systems 400, 500, 600 of FIGS. 4-6, respectively, or any other wireless power transfer system.

The flowchart 700 may begin at start block 702 and advance to block 704, which includes setting calculation ranges and initial values within those ranges for all system component characteristics that are variable in the simulation described by flowchart 700. These "characteristics" may include, but are not limited to, a number of turns for each of the primary coil and the secondary coil, a range of coupling factors "k" between the primary coil and the secondary coil, e.g., which may depend or be based on one or both of a chosen magnetics configuration (e.g., double D, double D quadrature, bipolar, coplanar coil geometries) and a physical offset between the primary coil and the secondary coil in any of the x, y, and z directions, a battery voltage (e.g., output voltage utilized to charge a battery by the wireless power transfer system), and a nominal power output $P_{out,nominal}$ of the wireless power receiver 430. These characteristics are only exemplary. Moreover, these characteristics are not the same as system limitations or user design constraints that will be utilized to filter output results from flowchart 700 in block 804 of FIG. 8 below.

A granularity of iterative adjustment to the values within these characteristic values within their respective ranges may also be determined or predetermined. For example, 2, 5, 10 or any number of equally or unequally spaced values within each of the above-described characteristic ranges may be determined for the above-mentioned characteristics and calculations for electrical component values, voltages, currents, phases between voltages and currents, impedances, and/or powers in the electrical circuits of the wireless power transfer system may be made based on each of these values within these ranges, allowing a multivariate analysis to be carried out. In some implementations, since the first resistance 406, the first leakage inductance 408, the mutual inductance 412, the second leakage inductance 410, and the second resistance 414 may depend on the particular magnetics configuration and x, y, z offset between the primary coil and the secondary coil, these values may be manually or automatically preloaded in a memory from magnetics simulation output data via a data interface. Flowchart 700 may advance to block 706.

Block 706 includes determining electrical circuit parameters of the wireless power transfer system based on the current values for each of the plurality of characteristics. For example, at the start, a lowest value in the range of each characteristic may be set and the electrical circuit parameters of the wireless power transfer system 400 may be determined based on those initial values of each of the plurality of characteristic. Non-limiting examples of such electrical circuit parameters to be determined may include $L_{leak}$, $C_1$, $L_{1S}$, $R_1$, $C_2$, $L_{2S}$, $R_2$, $R_L$, $L_M$, $V_{RL}$, $V_{C2}$, $V_{L2}$, $V_{L1}$, $V_{C1}$, $V_1$, $I_1$, $I_2$, and/or any other voltage, current, phase between voltage and current, power, or efficiency value associated with at least a portion of the wireless power transfer system circuitry. Flowchart 700 may advance to block 708.

Block 708 includes adjusting characteristic 1. For example, characteristic 1 may be the coupling coefficient (k) between the primary coil and the secondary coil (see FIGS. 4-6), which may be based on the magnetics configuration and x, y, z offsets between the primary and secondary coils. However, this is only an example and any other characteristic may be considered characteristic 1. In such implementations, the coupling value (k) between the primary coil and the secondary coil may be adjusted up to a next value in the preset range of x, y and z offset values. Flowchart 700 may advance to block 710.

Block 710 includes determining whether characteristic 1 is still within the preset range associated with characteristic 1 after the adjustment of block 708 (e.g., for the coupling coefficient (k)). This determination is not the same as a separate filtering step based on system limitations or user design constraints, as will be described in connection with block 804 of FIG. 8 below. If the determination is YES, the flowchart 700 may advance back to block 706 where electrical circuit parameters are determined again with the adjusted characteristic 1 value. If the determination is NO, the flowchart 700 may advance to block 712.

Block 712 includes resetting characteristic 1. For example, the coupling coefficient (k) between the primary coil and the secondary coil may be reset to its initial (e.g., lowest) value. The flowchart 700 may advance to block 714.

Block 714 includes adjusting characteristic 2. For example, in some implementations, characteristic 2 may be the battery voltage of the battery that is to be charged by the wireless power receiver 430 (e.g., the output charging voltage of the wireless power receiver 430). However, this is only an example and any other characteristic may be considered characteristic 2. In such implementations, the battery voltage may be adjusted up to a next value in the preset range of battery voltage values. Flowchart 700 may advance to block 716.

Block 716 includes determining whether characteristic 2 is still within the preset range associated with characteristic 2 after the adjustment at block 714 (e.g., for battery voltages). This determination is not the same as a separate filtering step based on system limitations or user design constraints, as will be described in connection with block 804 of FIG. 8 below. If the determination is YES, the flowchart 700 may advance back to block 706 where electrical circuit parameters are determined again with the adjusted characteristic 2 value. If the determination is NO, the flowchart 700 may advance to block 718.

Block 718 includes resetting characteristic 2. For example, the battery voltage may be reset to its initial (e.g., lowest) value. The flowchart 700 may advance to block 720.

Block 720 includes adjusting characteristic 3. For example, in some implementations, characteristic 3 may be the number of turns in the secondary coil (see FIGS. 4-6). However, this is only an example and any other characteristic may be considered characteristic 3. In such implementations, the number of turns in the secondary coil may be adjusted up to a next value in the preset range of number of turns. Flowchart 700 may advance to block 722.

Block 722 includes determining whether characteristic 3 is still within the preset range associated with characteristic 3 after the adjustment of block 720 (e.g., for number of turns). This determination is not the same as a separate filtering step based on system limitations or user design constraints, as will be described in connection with block 804 of FIG. 8 below. If the determination is YES, the flowchart 700 may advance back to block 706 where electrical circuit parameters are determined again with the adjusted characteristic 3 value. If the determination is NO, the flowchart 700 may advance to block 724.

Block 724 includes resetting characteristic 3. For example, the number of turns in the secondary coil may be reset to its initial (e.g., lowest) value. The flowchart 700 may advance to block 726.

Block 726 includes adjusting characteristic N. For example, in some implementations, characteristic N may be the number of turns in the primary coil (see FIGS. 4-6). However, this is only an example and any other characteristic may be considered characteristic N. In such implementations, the number of turns in the primary coil may be adjusted up to a next value in the present range of number of turns. The flowchart 700 may advance to block 728.

Block 728 includes determining whether characteristic N is still within the preset range associated with characteristic N after the adjustment of block 726 (e.g., for number of turns). This determination is not the same as a separate filtering step based on system limitations or user design constraints, as will be described in connection with block 804 of FIG. 8 below. If the determination is YES, the flowchart 700 may advance back to block 706 where electrical circuit parameters are determined again with the adjusted characteristic N value. If the determination is NO, the flowchart 700 may advance to end block 730.

It should be understood that, in some implementations, not every electrical circuit parameter must be recalculated for each iteration of block 706. For example, the values of the first capacitor 404 ($C_1$), the second capacitor 416 ($C_2$), the primary coil ($L_{1S}$) and the secondary coil 419 ($L_{2S}$) may not require recalculation until the number of turns in either the primary coil or in the secondary coil are adjusted. Thus, in some implementations, only those electrical circuit parameters that require recalculation due to the adjustment of one of the plurality of characteristics will be recalculated. In such implementations, electrical circuit parameters expected to remain unchanged by the immediately previous adjustment of one or more of the plurality of characteristics may be copied from the previous calculation at block 706.

In FIG. 7 only four characteristics are described (e.g., 1, 2, 3, and N). However, any number of characteristics may be added in series by adding blocks similar to blocks 720, 722 and 724, together, in line between block 724 and block 726. This is illustrated by the dotted line connecting block 724 to block 726. In this way, a computer-aided determination of the electrical circuit parameters of a wireless power transfer system may be made for each combination of values that fall within the respective ranges associated with each of the characteristics for the wireless power transfer system. For each implementation of block 706, the apparatus may additionally save the determined electrical parameters into a memory for further discrimination, as will be described in connection with FIG. 8 below. Moreover, the above determinations may be made for any number of different tuning topologies (e.g., series-series, parallel-parallel, parallel-parallel (partial series), or any combination of the same on the primary and/or the secondary side) and/or for each of any number of different primary and secondary coil magnetics configurations (e.g., double D, double D quadrature, bipolar, coplanar magnetics configurations). In such implementations, each change in tuning topology and/or magnetics configuration may also require selection, from a memory library, of a different set of calculation rules or algorithms for the electrical circuit parameters specific to that tuning topology and/or magnetics configuration to be used in block 706.

Figure 8:
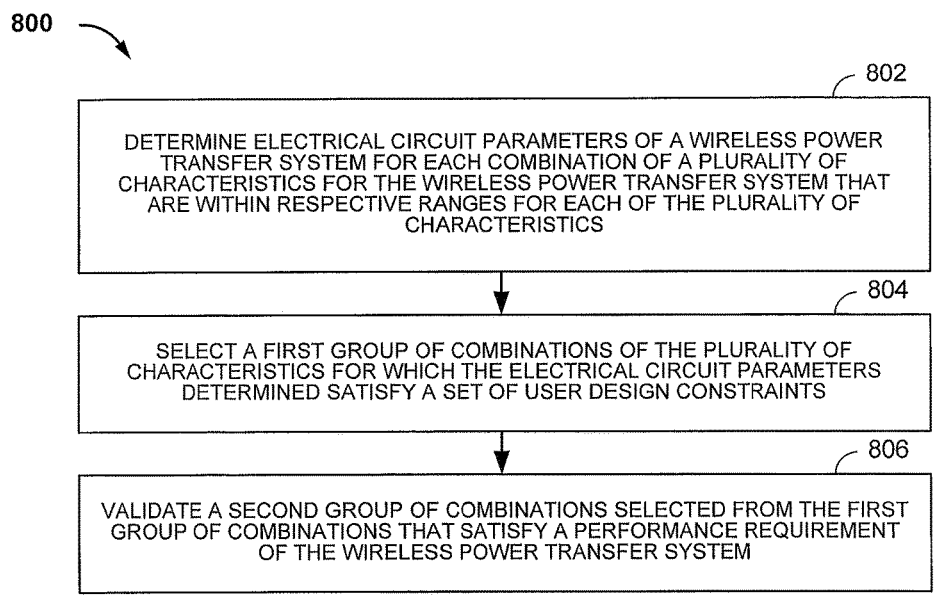
FIG. 8 is flowchart for a method for designing, tuning and matching of wireless power transfer systems, in accordance with some implementations.

FIG. 8 is a flowchart 800 depicting a method for computer aided design, tuning and matching of wireless power transfer systems, in accordance with some implementations. For example, the flowchart 800 may correspond to any of FIGS. 1-7 above.

Flowchart 800 may begin with block 802, which includes determining electrical circuit parameters of a wireless power transfer system for each combination of a plurality of characteristics for the wireless power transfer system that are within respective ranges for each of the plurality of characteristics. For example, block 802 may be carried out by performing flowchart 700 as previously described in connection with FIG. 7. Flowchart 800 may advance from block 802 to block 804.

Block 804 includes selecting a first group of combinations of the plurality of characteristics for which the electrical circuit parameters determined in block 802 satisfy a set of user design constraints. For example, in some implementations, wireless power transfer systems having a number of turns in the primary coil and a number of turns in the secondary coil that satisfy certain user design constraints and/or system limitations may be selected. Examples of such user design constraints and/or system limitations may include but are not limited to customer requirements such as a particular magnetics configuration, a tuning topology, and/or a restriction on a vehicle pad size or shape. Further examples of such user design constraints may include but are not limited to operating conditions of the wireless power transfer system such as or frequency of operation of the wireless power transfer system. Further examples of such user design constraints may include but are not limited to electrical and/or physical system limitations such as voltages appearing across and/or currents flowing through one or more electrical components, phases between voltages and currents, power outputs, efficiencies, or coil ampere-turns constraints within the wireless power transfer system.

Figure 9:
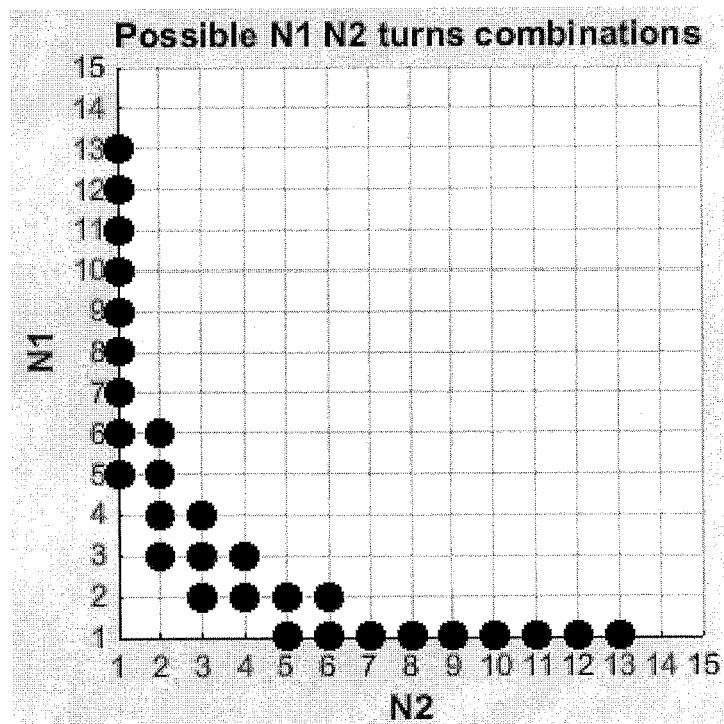
FIG. 9 illustrates a graph of a selection of a first group of electrical parameter combinations that satisfy a set of user design constraints on a wireless power transfer system, in accordance with some implementations.

In some implementations, the selection of this first group of combinations may be shown or output as a graph or grid showing the number of turns in the primary coil and in the secondary coil that satisfy this set of user design constraints. Such a graph 900 is shown in FIG. 9, where the number of turns in the primary coil (N1) are displayed on the vertical axis and the number of turns in the secondary coil (N2) are shown on the horizontal axis. Combinations of N1 and N2 having calculated electrical circuit parameters that satisfy the set of user design constraints and/or system limitations may be indicated by a dot or any other symbol. In some non-limiting implementations, selection of a particular dot may allow access to or display of all or at least a portion of the electrical parameters previously determined for that combination of N1 and N2 for a particular one or all of the associated tuning topologies and/or magnetics configurations. The flowchart 800 may advance to block 806.

Block 806 includes validating a second group of combinations selected from the first group of combinations that satisfy a performance requirement of the wireless power transfer system. For example, in some implementations, the performance requirement of the wireless power transfer system comprises the wireless power transfer system operating within a certain range of loaded quality factors ($Q_L$), which may also be known as the resonance detuning sensitivity. $Q_L$ may be determined according to Equation 7 below:

$$Q_L = \omega L_1 / (R_L \times (N_1/N_2)^2) \qquad \text{EQ. 7:}$$

where $\omega$ is the operating frequency of the wireless power transfer system in radians per second, $L_1$ is the inductance of the primary coil in Henries, $R_L$ is the impedance of the load on the wireless power receiver 430 at the operating frequency co in ohms (Ω), $N_1$ is the number of turns in the primary coil, and $N_2$ is the number of turns in the secondary coil.

It should be noted that $Q_L$ may be mainly affected by the turns count of the primary coil and of the secondary coil, since $L_1$ is determined based on the actual magnetics configuration and coupling factor (k) between the primary coil and the secondary coil, and since $R_L$ is determined based on minimal power output and the battery voltage range of the specific application. In some implementations, the algorithms utilized to determine any electrical circuit parameter or $Q_L$ value may be implemented in a MATLAB tuning and matching tool.

Figure 12:
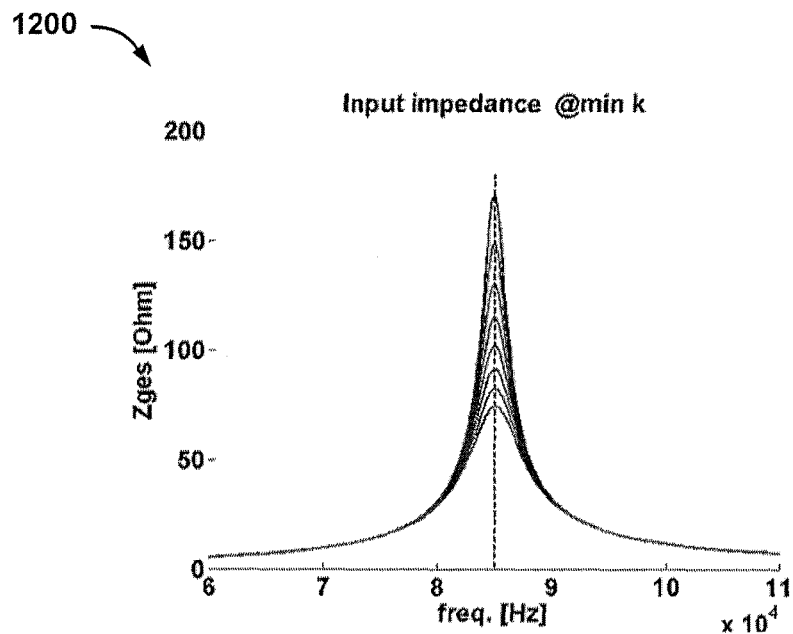
FIG. 12 illustrates another graph of system impedance (ohms, $\Omega$) versus frequency ($\times 10$ kHz) of a wireless power transfer system, in accordance with some implementations.
Figure 13:
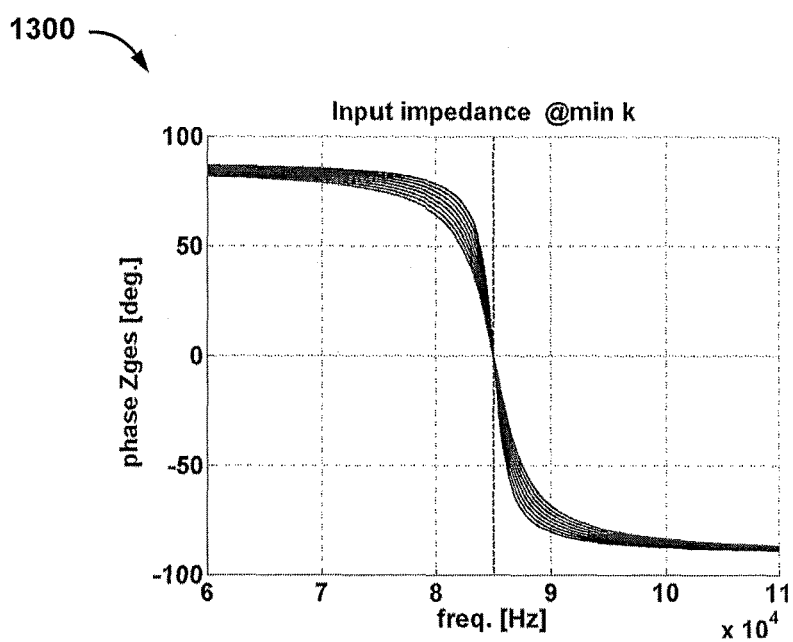
FIG. 13 illustrates a graph of a phase angle between a voltage and a current driven in the wireless power transfer system of FIG. 12.
Figure 14:
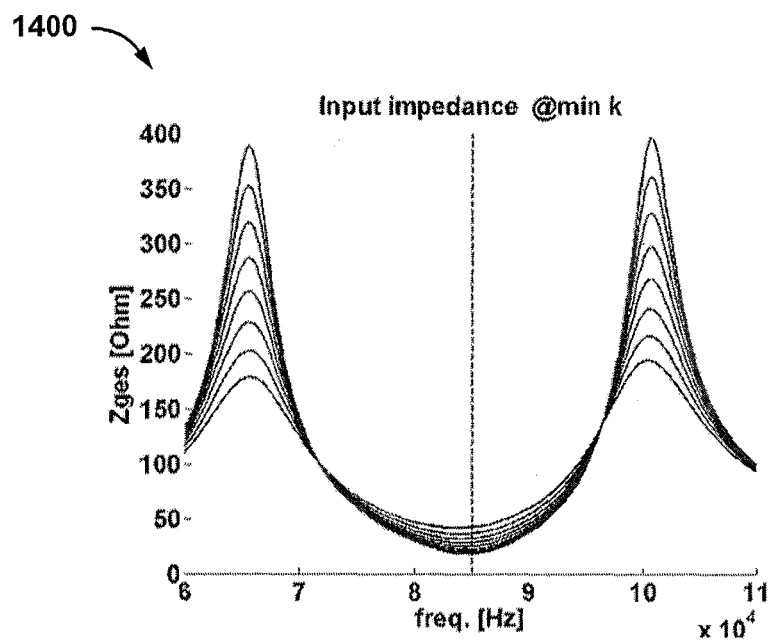
FIG. 14 illustrates another graph of system impedance (ohms, $\Omega$) versus frequency ($\times 10$ kHz) of a wireless power transfer system, in accordance with some implementations.
Figure 15:
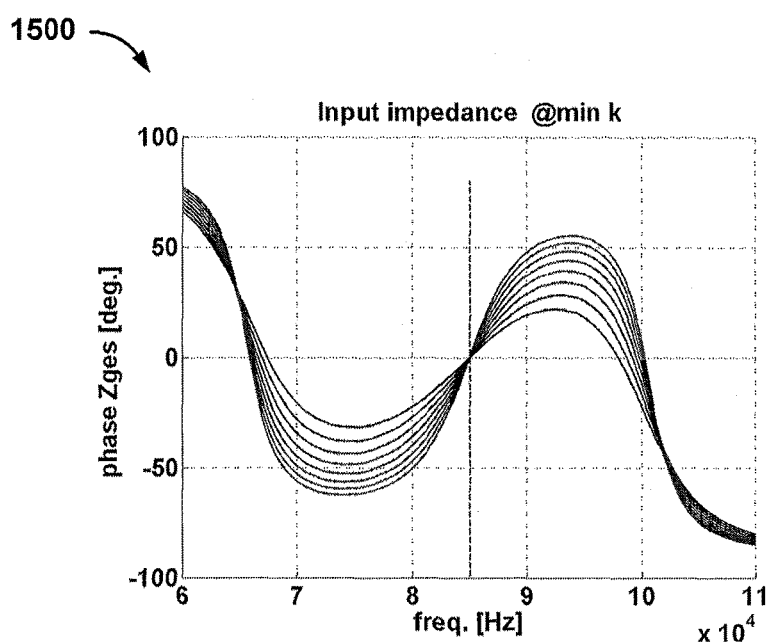
FIG. 15 illustrates a graph of a phase angle between a voltage and a current driven in the wireless power transfer system of FIG. 14.

It may be desirable that the range of loaded quality factors of the wireless power transfer system ($Q_L$) be in the range of 1 to 3, inclusive. This range represents a transition phase into a resonance peak bifurcation phenomenon where a single peak impedance of the system splits into two peak impedances, each at a different frequency, which is an undesirable operating condition as it forces operation at an impedance that is less than optimal and which cannot be tuned away simply by adjusting the capacitance values $C_1$ and/or $C_2$ (see FIG. 4). Examples, of system impedance versus frequency curves for $Q_L$ values within, below, and above this $1 \leq Q_L \leq 3$ range are shown in FIGS. 10, 12 and 14, respectively, while phase versus frequency curves for those $Q_L$ values are shown in FIGS. 11, 13 and 15, respectively.

In some implementations, the flowchart 800 may further include storing the electrical circuit parameters of the wireless power transfer system determined for each combination. In some implementations, the flowchart 800 may further include receiving the respective ranges for each of the plurality of characteristics for the wireless power transfer system. For example, a user may input minimum and maximum values for the ranges for number of turns in the primary and/or secondary coils. In some implementations, the flowchart 800 may further include storing a plurality of algorithms for determining the electrical circuit parameters of the wireless power transfer system. In some implementations, the flowchart 800 may further include accessing one or more of the plurality of algorithms based on at least one of a tuning topology and a magnetics configuration of the wireless power transfer system. In some implementations, the flowchart 800 may further include setting initial values for each of the plurality of characteristics for the wireless power transfer system. In some implementations, the flowchart 800 may further include adjusting a value of at least one of the plurality of characteristics after the electrical circuit parameters of the wireless power transfer system are determined for the initial values for each of the plurality of characteristics. In some implementations, a non-transitory, computer-readable medium comprising code that, when executed, causes an apparatus (see FIG. 16) for designing, tuning and matching of wireless power transfer systems to perform the blocks and/or other actions previously described in connection with the flowchart 800 of FIG. 8.

Figure 10:
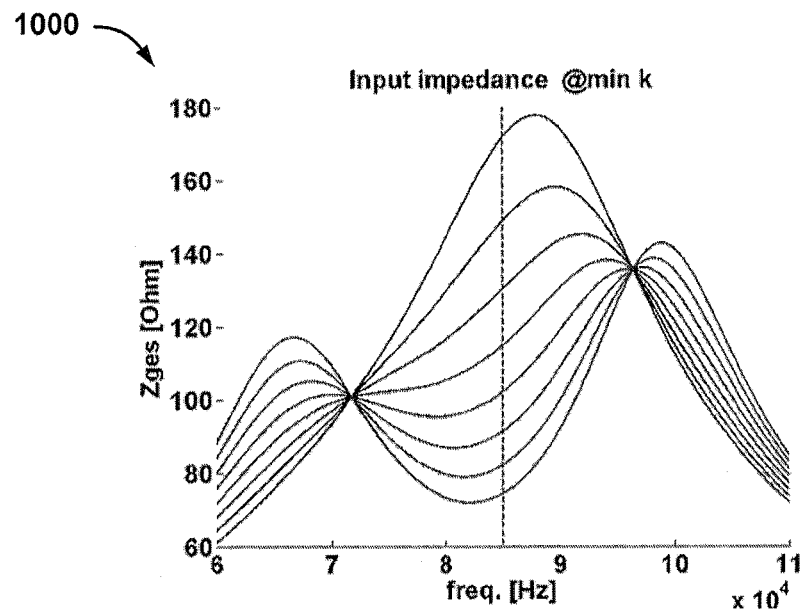
FIG. 10 illustrates a graph of system impedance (ohms, $\Omega$) versus frequency ($\times 10$ kHz) of a wireless power transfer system, in accordance with some implementations.

FIG. 10 illustrates a graph 1000 of system impedance (ohms, Ω) versus frequency (×10 kHz) of a wireless power transfer system, in accordance with some implementations. Graph 1000 shows a wireless power transfer system at loaded $Q_L$ values of between 0.9 and 2. Impedance is shown in ohms (Ω) on the vertical axis and resonance frequency is shown in units of 10 kHz on the horizontal axis for a primary coil having 6 turns and a secondary coil having 2 turns. As can be seen, the response curves have a relatively flat impedance response versus frequency near the resonance frequency shown by the dotted line.

Figure 11:
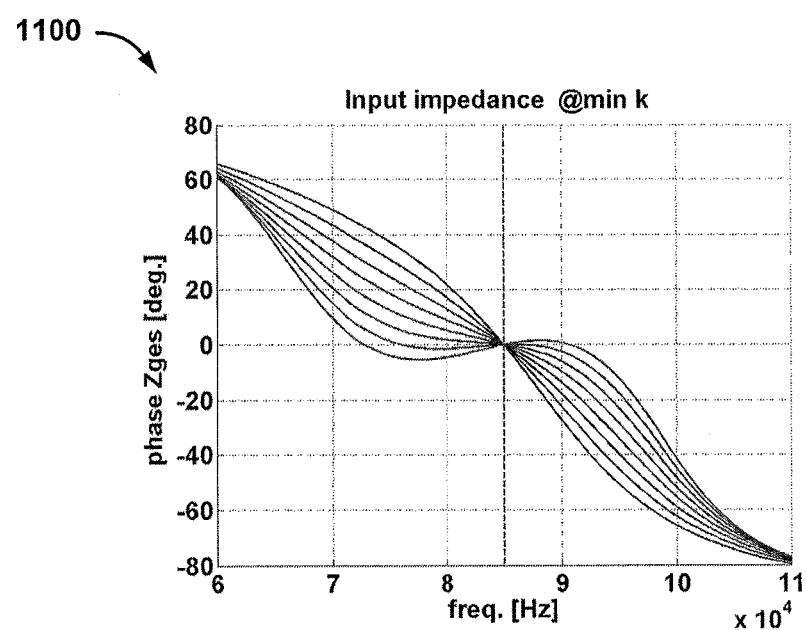
FIG. 11 illustrates a graph of a phase angle between a voltage and a current driven in the wireless power transfer system of FIG. 10.

FIG. 11 illustrates a graph 1100 of a phase angle between a voltage and a current driven in the wireless power transfer system of FIG. 10. Phase angle is shown in degrees (°) on the vertical axis and resonance frequency is shown in units of 10 kHz on the horizontal axis. The system is substantially inductive, decreasing to an in phase operation at the resonance frequency shown by the dotted line. As the frequency increases further, the system becomes more and more capacitive. However, due to the slow changes in impedance and phase over a wide range of frequencies, a system with this type of operation is desirable.

FIG. 12 illustrates another graph 1200 of system impedance (ohms, Ω) versus frequency (×10 kHz) of a wireless power transfer system, in accordance with some implementations. Graph 1200 shows a wireless power transfer system at loaded $Q_L$ values of between 0.1 and 0.2. Impedance is shown in ohms (Ω) on the vertical axis and resonance frequency is shown in units of 10 kHz on the horizontal axis for the primary coil 408 having 2 turns and a secondary coil having 6 turns. As can be seen, the response curves have a very sharp response versus frequency near the resonance frequency shown by the dotted line and fall off quickly to either side. This type of response is undesirable since power transfer efficiency may vary greatly for very small offsets in the resonance frequency.

FIG. 13 illustrates a graph 1300 of a phase angle between a voltage and a current driven in the wireless power transfer system of FIG. 12. Phase angle is shown in degrees (°) on the vertical axis and operating frequency is shown in units of 10 kHz on the horizontal axis. The system is inductive, maintaining substantially the same phase angle until near the resonance frequency at which point the phase angle changes rapidly, in phase at the operating frequency shown by the dotted line, and then continuing the rapid phase angle change to a capacitive system operation. A system with this type of operation is undesirable because both the phase angle and impedance of operation are highly unstable at frequencies near the resonance frequency.

FIG. 14 illustrates another graph 1400 of system impedance (ohms, Ω) versus frequency (×10 kHz) of a wireless power transfer system, in accordance with some implementations. Graph 1400 shows a wireless power transfer system at loaded $Q_L$ values of between 5.5 and 10.0. Impedance is shown in ohms (Ω) on the vertical axis and operating frequency is shown in units of 10 kHz on the horizontal axis for a primary coil having 6 turns and a secondary coil having 1 turn. As can be seen, all of the impedance curves are bifurcated, having two peaks at different frequencies far removed to either side of the resonance frequency, shown by the dotted line. Operation at such a loaded Q requires operating at efficiencies far less than optimal.

FIG. 15 illustrates a graph 1500 of a phase angle between a voltage and a current driven in the wireless power transfer system of FIG. 14. Phase angle is shown in degrees (°) on the vertical axis and operating frequency is shown in units of 10 kHz on the horizontal axis. The phase of the system is highly erratic, oscillating between inductive operation and capacitive operation on each side of the resonance frequency, shown by the dotted line. A system with this type of operation is undesirable both because the bifurcation phenomenon requires operation at a low efficiency and because the erratic phase angle swings are difficult to control.

Once the above-described simulations have been completed, a final design check may be instituted, which may include final power loss, induced voltage or current analysis, transient switching loss analysis and/or dynamics, compatible control system options, and current harmonics analysis and/or filtering options. Finally, a physical mock up or test device may be developed and physically tested to verify against the above-described simulation results. This may include final performance, voltage, current and/or electromagnetic interference testing.

Figure 16:
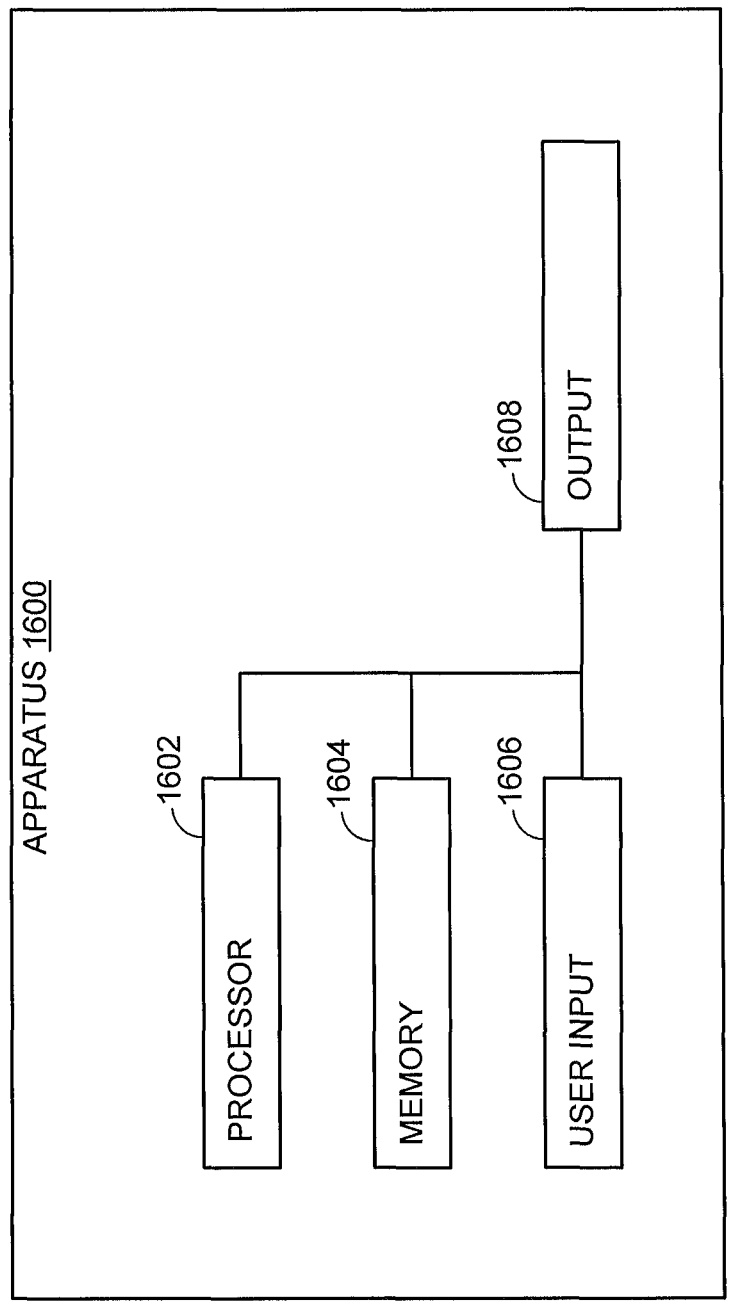
FIG. 16 illustrates an apparatus for designing, tuning and matching of wireless power transfer systems, in accordance with some implementations.

FIG. 16 illustrates an apparatus 1600 for designing, tuning and matching of wireless power transfer systems, in accordance with some implementations. The apparatus 1600 comprises a processor 1602. The processor may be configured to determine electrical circuit parameters of a wireless power transfer system 400 for each combination of a plurality of characteristics for the wireless power transfer system (see block 706 of FIG. 7 and block 802 of FIG. 8). In some implementations, this may comprise determining electrical circuit parameters of a wireless power transfer system for each combination of a number of turns in a primary coil and a number of turns in a secondary coil for the wireless power transfer system that are within a first range of the number of turns in the primary coil and within a second range of the number of turns of the secondary coil. The processor 1602 may further be configured to select a first group of combinations of the plurality of characteristics for which the electrical circuit parameters determined satisfy a set of user design constraints (see block 804 of FIG. 8). In some implementations, this may comprise selecting a first group of combinations of the number of turns in the primary coil and the number of turns in the secondary coil that satisfy a set of user design constraints. The processor 1602 may further be configured to validate a second group of combinations selected from the first group of combinations that satisfy a performance requirement of the wireless power transfer system (see block 806 of FIG. 8). In some implementations, this may comprise validating a second group of combinations selected from the first group of combinations that result in a loaded quality factor of the wireless power transfer system within a predetermined range. The processor 1602 may further be configured to access one or more of the plurality of algorithms based on at least one of a tuning topology and a magnetics configuration of the wireless power transfer system. The processor 1602 may further be configured to set ranges and initial values for each of the plurality of characteristics for the wireless power transfer system (see block 704 of FIG. 7). In some implementations, this may comprise setting initial values for each of the number of turns in the primary coil and the number of turns in the secondary coil. The processor 1602 may be further configured to adjust a value of at least one of the plurality of characteristics after the electrical circuit parameters of the wireless power transfer system are determined for the initial values for each of the plurality of characteristics (see any of blocks 708, 714, 720 or 726 of FIG. 7). In some implementations, this may comprise adjusting a value of at least one of the number of turns in the primary coil and the number of turns in the secondary coil after the electrical circuit parameters of the wireless power transfer system are determined for the initial values for each of the number of turns in the primary coil and the number of turns in the secondary coil.

In some implementations, the processor 1602 may also be known as, or comprise at least a portion of "means for determining electrical circuit parameters of a wireless power transfer system for each combination of a plurality of characteristics for the wireless power transfer system that are within respective ranges for each of the plurality of characteristics," "means for selecting a first group of combinations of the plurality of characteristics for which the electrical circuit parameters determined satisfy a set of user design constraints," "means for validating a second group of combinations selected from the first group of combinations that satisfy a performance requirement of the wireless power transfer system," "means for accessing one or more of the plurality of algorithms based on at least one of a tuning topology and a magnetics configuration of the wireless power transfer system," "means for setting initial values for each of the plurality of characteristics for the wireless power transfer system," and/or "means for adjusting a value of at least one of the plurality of characteristics after the electrical circuit parameters of the wireless power transfer system are determined for the initial values for each of the plurality of characteristics."

The apparatus 1600 may also include a memory 1604, which may be configured to store the electrical circuit parameters of the wireless power transfer system determined for each combination, and/or store a plurality of algorithms for determining the electrical circuit parameters of the wireless power transfer system. In some implementations, this may comprise storing the electrical circuit parameters of the wireless power transfer system determined for each combination of the number of turns in the primary coil and the number of turns in the secondary coil. In some implementations, the memory 1604 may also be known as, or comprise at least a portion of "means for storing the electrical circuit parameters of the wireless power transfer system determined for each combination," and/or "means for storing a plurality of algorithms for determining the electrical circuit parameters of the wireless power transfer system."

The apparatus 1600 may additionally include a data interface 1606 configured to receive the plurality of ranges of characteristics for the wireless power transfer system. In some implementations, this may comprise receiving a first range for the number of turns in the primary coil and a second range for the number of turns in the secondary coil. In some implementations, the data interface 1606 may comprise any user interface, data interface, or peripheral device, for example a keyboard, that may be utilized to input such ranges of the characteristics. In some implementations, the data interface 1606 may also be known as, or comprise at least a portion of "means for receiving the respective ranges for each of the plurality of characteristics for the wireless power transfer system."

The apparatus 1600 may further include an output 1608 configured to display or output one or more of the electrical circuit parameters of a wireless power transfer system determined for each combination of a plurality of characteristics for the wireless power transfer system that are within respective ranges for each of the plurality of characteristics. In some implementations, the output 1608 may also be known as, or comprise at least a portion of "means for displaying or outputting one or more of the electrical circuit parameters of a wireless power transfer system determined for each combination of a plurality of characteristics for the wireless power transfer system."

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC.

For purposes of summarizing the disclosure, certain aspects, advantages and novel features have been described herein. It is to be understood that not necessarily all such advantages may be achieved in accordance with any particular implementation. Thus, one or more implementations achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for designing, tuning and matching of wireless power transfer systems, comprising:
    a processor configured to:
        determine electrical circuit parameters of a wireless power transfer system for each combination of a plurality of characteristics for the wireless power transfer system that are within respective ranges for each of the plurality of characteristics,
        select a first group of combinations of the plurality of characteristics for which the electrical circuit parameters determined satisfy a set of user design constraints, and
        validate a second group of combinations selected from the first group of combinations that satisfy a performance requirement of the wireless power transfer system.

2. The apparatus of claim 1, further comprising a memory configured to store the electrical circuit parameters of the wireless power transfer system determined for each combination.

3. The apparatus of claim 1, further comprising a data interface configured to receive the respective ranges for each of the plurality of characteristics for the wireless power transfer system.

4. The apparatus of claim 1, further comprising a memory configured to store a plurality of algorithms for determining the electrical circuit parameters of the wireless power transfer system, wherein the processor is configured to access one or more of the plurality of algorithms based on at least one of a tuning topology and a magnetics configuration of the wireless power transfer system.

5. The apparatus of claim 1, wherein the processor is further configured to:
    set initial values for each of the plurality of characteristics for the wireless power transfer system; and
    adjust a value of at least one of the plurality of characteristics after the electrical circuit parameters of the wireless power transfer system are determined for the initial values for each of the plurality of characteristics.

6. The apparatus of claim 1, wherein the plurality of characteristics for the wireless power transfer system comprise at least one of a number of turns in a primary coil, a number of turns in a secondary coil, a coupling coefficient between the primary coil and the secondary coil, an output voltage of a wireless power receiver, a power output of the wireless power receiver, a tuning topology, and a frequency of operation.

7. The apparatus of claim 1, wherein the set of user design constraints comprise at least one of a voltage or current of a capacitor, a phase angle of the wireless power transfer system, and a capacitor calculation method.

8. The apparatus of claim 1, wherein the performance requirement of the wireless power transfer system comprises a range of loaded quality factors of the wireless power transfer system.

9. A method for designing, tuning and matching of wireless power transfer systems, comprising:

determining electrical circuit parameters of a wireless power transfer system for each combination of a plurality of characteristics for the wireless power transfer system that are within respective ranges for each of the plurality of characteristics;

selecting a first group of combinations of the plurality of characteristics for which the electrical circuit parameters determined satisfy a set of user design constraints; and validating a second group of combinations selected from the first group of combinations that satisfy a performance requirement of the wireless power transfer system.

10. The method of claim 9, further comprising storing the electrical circuit parameters of the wireless power transfer system determined for each combination.

11. The method of claim 9, further comprising receiving the respective ranges for each of the plurality of characteristics for the wireless power transfer system.

12. The method of claim 9, further comprising:
storing a plurality of algorithms for determining the electrical circuit parameters of the wireless power transfer system; and
accessing one or more of the plurality of algorithms based on at least one of a tuning topology and a magnetics configuration of the wireless power transfer system.

13. The method of claim 9, further comprising:
setting initial values for each of the plurality of characteristics for the wireless power transfer system; and
adjusting a value of at least one of the plurality of characteristics after the electrical circuit parameters of the wireless power transfer system are determined for the initial values for each of the plurality of characteristics.

14. The method of claim 9, wherein the plurality of characteristics for the wireless power transfer system comprise at least one of a number of turns in a primary coil, a number of turns in a secondary coil, a coupling coefficient between the primary coil and the secondary coil, an output voltage of a wireless power receiver, a power output of a wireless power receiver, a tuning topology, and a frequency of operation.

15. The method of claim 9, wherein the set of user design constraints comprise at least one of a voltage or current of a capacitor, a phase angle of the wireless power transfer system, and a capacitor calculation method.

16. The method of claim 9, wherein the performance requirement of the wireless power transfer system comprises a range of loaded quality factors of the wireless power transfer system.

17. A non-transitory, computer-readable medium comprising code that, when executed, causes an apparatus for designing, tuning and matching of wireless power transfer systems to:
determine electrical circuit parameters of a wireless power transfer system for each combination of a plurality of characteristics for the wireless power transfer system that are within respective ranges for each of the plurality of characteristics;
select a first group of combinations of the plurality of characteristics for which the electrical circuit parameters determined satisfy a set of user design constraints; and
validate a second group of combinations selected from the first group of combinations that satisfy a performance requirement of the wireless power transfer system.

18. The medium of claim 17, wherein the code, when executed, further causes the apparatus to store the electrical circuit parameters of the wireless power transfer system determined for each combination.

19. The medium of claim 17, wherein the code, when executed, further causes the apparatus to receive the respective ranges for each of the plurality of characteristics for the wireless power transfer system.

20. The medium of claim 17, wherein the code, when executed, further causes the apparatus to:
store a plurality of algorithms for determining the electrical circuit parameters of the wireless power transfer system; and
access one or more of the plurality of algorithms based on at least one of a tuning topology and a magnetics configuration of the wireless power transfer system.

21. The medium of claim 17, wherein the code, when executed, further causes the apparatus to:
set initial values for each of the plurality of characteristics for the wireless power transfer system; and
adjust a value of at least one of the plurality of characteristics after the electrical circuit parameters of the wireless power transfer system are determined for the initial values for each of the plurality of characteristics.

22. The medium of claim 17, wherein the plurality of characteristics for the wireless power transfer system comprise at least one of a number of turns in a primary coil, a number of turns in a secondary coil, a coupling coefficient between the primary coil and the secondary coil, an output voltage of a wireless power receiver, a power output of a wireless power receiver, a tuning topology, and a frequency of operation.

23. The medium of claim 17, wherein the set of user design constraints comprise at least one of a voltage or current of a capacitor, a phase angle of the wireless power transfer system, and a capacitor calculation method.

24. The medium of claim 17, wherein the performance requirement of the wireless power transfer system comprises a range of loaded quality factors of the wireless power transfer system.

25. An apparatus for designing, tuning and matching of wireless power transfer systems, comprising:
a processor configured to:
determine electrical circuit parameters of a wireless power transfer system for each combination of a number of turns in a primary coil and a number of turns in a secondary coil for the wireless power transfer system that are within a first range of the number of turns in the primary coil and within a second range of the number of turns of the secondary coil,
select a first group of combinations of the number of turns in the primary coil and the number of turns in the secondary coil that satisfy a set of user design constraints, and
validate a second group of combinations selected from the first group of combinations that result in a loaded quality factor of the wireless power transfer system within a predetermined range.

26. The apparatus of claim 25, further comprising a memory configured to store the electrical circuit parameters of the wireless power transfer system determined for each combination of the number of turns in the primary coil and the number of turns in the secondary coil.

27. The apparatus of claim 25, further comprising a data interface configured to receive a first range for the number of turns in the primary coil and a second range for the number of turns in the secondary coil.

28. The apparatus of claim 25, further comprising a memory configured to store a plurality of algorithms for determining the electrical circuit parameters of the wireless power transfer system, wherein the processor is configured to access one or more of the plurality of algorithms based on at least one of a tuning topology and a magnetics configuration of the wireless power transfer system.

29. The apparatus of claim 25, wherein the processor is further configured to:
   set initial values for each of the number of turns in the primary coil and the number of turns in the secondary coil, and
   adjust a value of at least one of the number of turns in the primary coil and the number of turns in the secondary coil after the electrical circuit parameters of the wireless power transfer system are determined for the initial values for each of the number of turns in the primary coil and the number of turns in the secondary coil.

30. The apparatus of claim 25, wherein the set of user design constraints comprise at least one of a voltage or current of a capacitor, a phase angle of the wireless power transfer system, and a capacitor calculation method.

* * * * *